(12) United States Patent
Haraki et al.

(10) Patent No.: US 11,094,526 B2
(45) Date of Patent: Aug. 17, 2021

(54) LIQUID COMPOSITION FOR IMPARTING ALCOHOL-REPELLENCY TO SEMICONDUCTOR SUBSTRATE MATERIAL, AND METHOD FOR TREATING SURFACE OF SEMICONDUCTOR SUBSTRATE USING SAID LIQUID COMPOSITION

(71) Applicant: Mitsubishi Gas Chemical Company, Inc., Chiyoda-ku (JP)

(72) Inventors: Suguru Haraki, Tokyo (JP); Kenji Shimada, Tokyo (JP)

(73) Assignee: Mitsubishi Gas Chemical Company, Inc., Chiyoda-ku (JP)

( * ) Notice: Subject to any disclaimer, the term of this patent is extended or adjusted under 35 U.S.C. 154(b) by 615 days.

(21) Appl. No.: 16/069,660

(22) PCT Filed: Jan. 10, 2017

(86) PCT No.: PCT/JP2017/000360
§ 371 (c)(1),
(2) Date: Jul. 12, 2018

(87) PCT Pub. No.: WO2017/122600
PCT Pub. Date: Jul. 20, 2017

(65) Prior Publication Data
US 2019/0019672 A1 Jan. 17, 2019

(30) Foreign Application Priority Data
Jan. 13, 2016 (JP) .............................. JP2016-004109

(51) Int. Cl.
| | |
|---|---|
| *H01L 21/02* | (2006.01) |
| *C09D 7/65* | (2018.01) |
| *C09D 7/63* | (2018.01) |
| *C09D 5/00* | (2006.01) |
| *C09D 5/16* | (2006.01) |
| *C09K 3/18* | (2006.01) |
| *G03F 7/40* | (2006.01) |
| *H01L 21/321* | (2006.01) |
| *H01L 21/3105* | (2006.01) |

(52) U.S. Cl.
CPC .......... *H01L 21/02057* (2013.01); *C09D 5/00* (2013.01); *C09D 5/16* (2013.01); *C09D 7/63* (2018.01); *C09D 7/65* (2018.01); *C09K 3/18* (2013.01); *G03F 7/40* (2013.01); *H01L 21/02118* (2013.01); *H01L 21/02282* (2013.01); *H01L 21/3105* (2013.01); *H01L 21/321* (2013.01)

(58) Field of Classification Search
CPC ......... H01L 21/02057; H01L 21/02118; H01L 21/02282; H01L 21/3105; H01L 21/321; C09D 7/65; C09D 7/63; C09D 5/00; C09D 5/16; C09K 3/18; G03F 7/40

USPC .......................................................... 524/130
See application file for complete search history.

(56) References Cited

U.S. PATENT DOCUMENTS

| | | |
|---|---|---|
| 2008/0293891 A1 | 11/2008 | Lyons et al. |
| 2010/0240219 A1 | 9/2010 | Tomita et al. |
| 2012/0214722 A1* | 8/2012 | Ohto ................. H01L 21/02057 510/175 |
| 2013/0008868 A1 | 1/2013 | Uozumi et al. |
| 2014/0065295 A1 | 3/2014 | Emoto et al. |

FOREIGN PATENT DOCUMENTS

| | | |
|---|---|---|
| JP | 9-31449 A | 2/1997 |
| JP | 2010-114414 A | 5/2010 |

(Continued)

OTHER PUBLICATIONS

U.S. Appl. No. 16/069,660—EIC—STN—Search (Year: 2021).*

(Continued)

*Primary Examiner* — Ling Siu Choi
*Assistant Examiner* — Ronald Grinsted
(74) *Attorney, Agent, or Firm* — Oblon, McClelland, Maier & Neustadt, L.L.P.

(57) ABSTRACT

A liquid composition for imparting alcohol-repellency to a semiconductor substrate material and a method for treating a semiconductor substrate surface using the liquid composition, are disclosed. The liquid composition contains: a surfactant (A) having a substituent of formula (1) (where n is an integer of 3 to 20), and an anionic hydrophilic group; and a compound (B) being selected from the group consisting of compounds having a polyethylenimine and a substituent of formula (2) or formula (3) (where $R^1$, $R^2$, $R^3$ and $R^4$ are each independently hydrogen or a C1-6 alkyl, alkenyl, alkynyl, or aryl, and $X^-$ is a fluoride ion, a chloride ion, a bromide ion, an iodide ion, a fluoroborate ion, a phosphate ion, an acetate ion, a trifluoroacetate ion, a sulfate ion, a hydrogen sulfate ion, a methane sulfate ion, a hydroxide ion, a perchlorate ion, or a nitrate ion).

$$—C_nF_{2n+1} \quad (1)$$

$$—N\begin{matrix}R^1\\R^2\end{matrix} \quad (2)$$

$$—\overset{+}{N}\begin{matrix}R^3\\|\\\end{matrix}—R^4 \quad X^- \quad (3)$$

12 Claims, No Drawings

(56) References Cited

FOREIGN PATENT DOCUMENTS

| JP | 2012-214664 A | 11/2012 |
| JP | 2013-16699 A | 1/2013 |
| JP | 2014-197571 A | 10/2014 |
| JP | 2014-197638 A | 10/2014 |
| WO | WO 2010/113646 A1 | 10/2010 |
| WO | WO 2011/049091 A1 | 4/2011 |

OTHER PUBLICATIONS

International Search Report dated Apr. 4, 2017, in PCT/JP2017/000360 filed Jan. 10, 2017.
Extended European Search Report dated Jul. 19, 2019 in corresponding European Patent Application No. 17738354.4, 5 pages.

* cited by examiner

LIQUID COMPOSITION FOR IMPARTING ALCOHOL-REPELLENCY TO SEMICONDUCTOR SUBSTRATE MATERIAL, AND METHOD FOR TREATING SURFACE OF SEMICONDUCTOR SUBSTRATE USING SAID LIQUID COMPOSITION

TECHNICAL FIELD

The present invention relates to a liquid composition for imparting alcohol-repellency to a semiconductor substrate material, and a method for treating a surface of a semiconductor substrate by using the same.

BACKGROUND ART

A process of fabricating a semiconductor device includes a step of forming fine unevenness on a surface of a semiconductor substrate. Such fine unevenness is generally formed by a method like the following method. Specifically, a photoresist is uniformly applied onto a surface of a flatly deposited semiconductor substrate material to provide a photosensitive layer, which is then subjected to selective exposure and development to provide a desired photoresist pattern. Subsequently, using this photoresist pattern as a mask, a semiconductor substrate material to be provided with unevenness is subjected to dry etching to form a desired pattern on said thin film. Then, the photoresist pattern and the residue resulting from the dry etching are completely removed with a removal solution and a cleaning solution. Thereafter, the surface is rinsed with pure water remove said removal solution and cleaning solution therefrom. This pure water is removed and dried from the semiconductor substrate by rotating the substrate at a high speed.

Due to the micronization of the design rule, rise of the height and reduction of the line width of the finely uneven pattern have increased the aspect ratio thereof. When such a high aspect ratio pattern is rinsed with water, the pattern may collapse due to the capillary force of water. The capillary force is proportional to the surface tension. Accordingly, in order to solve this problem, isopropyl alcohol (hereinafter, referred to as "IPA") whose surface tension is smaller than water is used for rinsing. However, if the aspect ratio (pattern height/line width) is, for example, as high as 25 where the finely uneven pattern has a height of 500 nm and a line width of 20 nm, the pattern collapse may occur even when IPA is used for rinsing. Therefore, such an IPA treatment alone is insufficient.

The method for solving the problem of such pattern collapse may be a method in which the pattern surface is hydrophobized to make the contact angle between the pattern and water closer to 90 degrees, thereby preventing pattern collapse upon rinsing with water.

The pattern, however, has minute unevenness and such surface unevenness affects the contact angle. Therefore, even if the contact angle with pure water is 90 degrees on a flat plane, it is impossible to completely eliminate the force associated with collapse in the actual pattern. Furthermore, a force resulting from surface tension is also applied to the pattern. Since this force is expressed as the product of the sine of the contact angle and the surface tension, it becomes large when the contact angle is 90 degrees. Therefore, in a recent unconventionally high aspect ratio pattern, collapse of the pattern is becoming less likely to be prevented only by hydrophobizing the pattern surface as described above.

In order to solve this problem, alcohols that have lower surface tension than water, for example, IPA can be used for cleaning, but even when IPA is used, an IPA repelling technology is strongly required for making the contact angle between IPA and the pattern larger to prevent the collapse.

In Patent Literatures 1, 2 and 3, a method for treating a surface of a semiconductor substrate is proposed, which includes: subjecting the semiconductor substrate to wetting treatment using a liquid chemical; removing the liquid chemical with pure water, forming a water-repellent protective film on the surface of the semiconductor substrate; rinsing the semiconductor substrate with pure water; and drying the semiconductor substrate. Moreover, a silane-based compound is proposed as an agent for forming the water-repellent protective film.

Patent Literature 4 proposes a surface treating agent that can be used for treating surfaces of various base materials, including a silane-based compound having a fluorocarbon group, an acid catalyst and a liquid or solid medium.

Patent Literature 5 proposes a surface treating agent containing a copolymer of acrylic ester having a linear C6 perfluoroalkyl group and methacrylic ester having a linear C6 perfluoroalkyl group, as a surface treating agent having IPA-repellency that is applicable to treatments of surfaces of various base materials.

CITATION LIST

Patent Literatures

Patent Literature 1: Japanese Unexamined Patent Application Publication No. 2010-114414
Patent Literature 2: Japanese Unexamined Patent Application Publication No. 2014-197638
Patent Literature 3: Japanese Unexamined Patent Application Publication No. 2014-197571
Patent Literature 4: Japanese Unexamined Patent Application Publication No. Heisei 9-31449
Patent Literature 5: International Publication No. WO2010/113646

SUMMARY OF INVENTION

Technical Problem

The inventions of Patent Literatures 1-5, however, have technical problems as described below.

Patent Literature 1 describes a method for treating a surface of a semiconductor substrate, comprising hexamethyldisilazane or trimethylsilyl dimethylamine. Patent Literature 2 discloses use of octyldimethylsilyl dimethylamine or trimethylsilyl dimethylamine, and Patent Literatures 3 and 4 each propose a method for forming a water-repellent protective film with tetramethylsilane and a silane-based compound such as perfluorodecyl trimethoxysilane, respectively. With the water-repellent protective films disclosed in these literatures, however, the contact angle between the material formed on the semiconductor substrate and the alcohol is insufficient and thus cannot be employed for the purpose of the present invention (for example, Comparative examples 23-50).

A surface treating agent containing the copolymer described in Patent Literature 5 can be applied and dried on a surface of a semiconductor substrate to impart oil-repellency to the surface of the semiconductor substrate. When, however, IPA is used for rinsing without drying the surface treating agent, the surface treating agent on the semiconductor substrate flows out without curing and therefore an oil-repellent film cannot be formed (for example, Comparative examples 51-54).

On the other hand, when said surface treating agent is dried, a thick film is formed on the semiconductor substrate, which may interfere the substrate to exert proper functions as a semiconductor.

Under such circumstances, there have been needs to provide a liquid composition for imparting alcohol-repellency to a surface of a material constituting a semiconductor substrate, and a method for treating a surface of a semiconductor substrate using the same.

Solution to Problem

The present invention provides a method for solving the above-described problems. The present invention comprises a liquid composition and a method for treating a surface of a semiconductor substrate shown below.

1. A liquid composition for imparting alcohol-repellency to a semiconductor substrate material, comprising 0.01-15% by mass of a surfactant (A) shown below, and 0.0001-20% by mass of a compound (B) shown below having a weight-average molecular weight of 200-500000 and 4-30 mmol of an amino group per gram.

Surfactant (A): a surfactant having a substituent represented by General formula (1) below and an anionic hydrophilic group Compound (B): Polyethylenimine or a compound having a substituent represented by General formula (2) or (3) below:

[Chemical formula 1]

$C_nF_{2n+1}-$ (1)

where n is an integer of 3-20,

[Chemical formula 2]

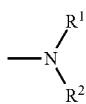

(2)

where $R^1$ and $R^2$ are hydrogen or a C1-6 alkyl, alkenyl, alkynyl or aryl group,

[Chemical formula 3]

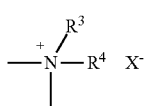

(3)

where $R^3$ and $R^4$ are hydrogen or a C1-6 alkyl, alkenyl, alkynyl or aryl group, and $X^-$ represents a fluoride ion, a chloride ion, a bromide ion, an iodide ion, a fluoroborate ion, a phosphate ion, an acetate ion, a trifluoroacetate ion, a sulfate ion, a hydrogen sulfate ion, a methane sulfate ion, a hydroxide ion, a perchlorate ion or a nitrate ion.

2. The liquid composition according to Item 1, wherein the anionic hydrophilic group has a structure represented by Formula (4), (5), (6) or (7) below:

[Chemical formula 4]

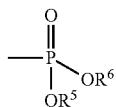

(4)

where $R^5$ and $R^6$ represent hydrogen or a C1-6 alkyl, alkenyl, alkynyl or aryl group,

[Chemical formula 5]

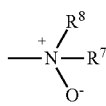

(5)

where $R^7$ and $R^8$ represent hydrogen or a C1-6 alkyl, alkenyl, alkynyl or aryl group,

[Chemical formula 6]

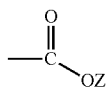

(6)

where Z represents a metal, hydrogen or a quaternary amine,

[Chemical formula 7]

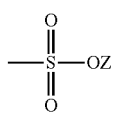

(7)

where Z represents a metal, hydrogen or a quaternary amine.

3. The liquid composition according to Item 1, wherein the compound (B) having a weight-average molecular weight of 200-500000 and having 4-30 mmol of an amino group per gram is a homopolymer or a copolymer comprising one or more compounds selected from the following as a starting material monomer: ethyleneimine, prop-2-en-1-amine, N-methylprop-2-en-1-amine, N,N-dimethylprop-2-en-1-amine, N-ethylprop-2-en-1-amine, N-ethyl-N-methylprop-2-en-1-amine, N,N-diethylprop-2-en-1-amine, 2-methylprop-2-en-1-amine, N,2-dimethylprop-2-en-1-amine, N,N,2-trimethylprop-2-en-1-amine, N-ethyl-2-methylprop-2-en-1-amine, N-ethyl-N,2-dimethylprop-2-en-1-amine, N,N-diethyl-2-methylprop-2-en-1-amine, but-2-en-1-amine, N-methylbut-2-en-1-amine, N,N-dimethylbut-2-en-1-amine, N-ethylbut-2-en-1-amine, N-ethyl-N-methylbut-2-en-1-amine, N,N-diethylbut-2-en-1-amine, 2-methylbut-2-en-1-amine, N,2-dimethylbut-2-en-1-amine, N,N,2-trimethylbut-2-en-1-amine, N-ethyl-2-methylbut-2-en-1-amine, N-ethyl-N,2-dimethylbut-2-en-1-amine, N,N-diethyl-2-methylbut-2-en-1-amine, 2,3-dimethylbut-2-en-1-amine, N,2,3-trimethylbut-2-en-1-amine, N,N,2,3-tetramethylbut-2-en-1-amine, N-ethyl-2,3-dimethylbut-2- en-1-amine, N-ethyl-N,2,3-trimethylbut-2-en-1-amine, N,N-diethyl-2,3-dimethylbut-2-en-1-amine, diallylamine, N-allyl-N-methylprop-2-en-1-amine, N-allyl-N-ethylprop-2-en-1-amine, N-allyl-N,N-dimethylprop-2-en-1-amine, and a hydrochloride, a sulfate, a phosphate, a nitrate and a sulfur dioxide thereof.

4. The liquid composition according to Item 1, wherein the surfactant (A) is N,N-diethyl-N',N'-bis(2-hydroxy-3-perfluorohexylpropyl)propane-1,3-diaminedioxide, N,N-diethyl-N',N'-bis(2-hydroxy-3-perfluoropentylpropyl)propan-1,3-diaminedioxide, N,N-diethyl-N',N'-bis(2-hydroxy-3-perfluorobutylpropyl)propane-1,3-diaminedioxide, N,N-dimethyl-N',N'-bis(2-hydroxy-3-perfluorohexylpropyl)propane-1,3-diaminedioxide, N,N-dimethyl-N',N'-bis(2-hydroxy-3-perfluoropentylpropyl)propane-1,3-diaminedioxide, N,N-dimethyl-N',N'-bis(2-hydroxy-3-perfluorobutylpropyl)propane-1,3-diaminedioxide, perfluorohexadecanoic acid, perfluoropentadecanoic acid, perfluorotetradecanoic acid, perfluorotridecanoic acid, perfluorododecanoic acid, perfluoroundecanoic acid, perfluorodecanoic acid, perfluorononanoic acid, perfluorooctanoic acid, perfluoroheptanoic acid, perfluorohexanoic acid, perfluoropentanoic acid, perfluorobutanoic acid, perfluorooctanesulfonic acid, perfluoroheptanesulfonic acid, perfluorohexanesulfonic acid, perfluoropentanesulfonic acid, perfluorobutanesulfonic acid, perfluoropropanesulfonic acid, perfluorooctylphosphonic acid, perfluoroheptylphosphonic acid, perfluorohexylphosphonic acid, perfluoropentylphosphonic acid, perfluorobutylphosphonic acid, perfluoropropylphosphonic acid, (1H,1H,2H,2H-perfluorodecyl) phosphonic acid, (1H,1H,2H,2H-perfluorononyl) phosphonic acid, (1H,1H,2H,2H-perfluorooctyl)phosphonic acid, (1H,1H,2H,2H-perfluoroheptyl)phosphonic acid, (1H, 1H,2H,2H-perfluorohexyl)phosphonic acid, (1H,1H,2H,2H-perfluoropentyl)phosphonic acid, a compound represented by any one of Formulae (8)-(11) below:

[Chemical formula 8]

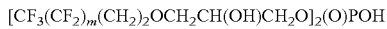

$[CF_3(CF_2)_m(CH_2)_2OCH_2CH(OH)CH_2O]_2(O)POH$ (8)

where m is an integer of 2-7,

[Chemical formula 9]

$[CF_3(CF_2)_kCH(OH)CH_2O]_2(O)POH$ (9)

where k is an integer of 2-7,

[Chemical formula 10]

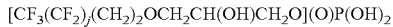

$[CF_3(CF_2)_j(CH_2)_2OCH_2CH(OH)CH_2O](O)P(OH)_2$ (10)

where j is an integer of 2-7,

[Chemical formula 11]

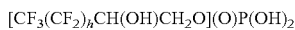

$[CF_3(CF_2)_hCH(OH)CH_2O](O)P(OH)_2$ (11)

where h is an integer of 2-7,
and a metal salt or an ammonium salt thereof.

5. The liquid composition for a semiconductor substrate according to Item 1, wherein the alcohol showing alcohol-repellency is isopropyl alcohol.

6. The liquid composition according to Item 1, wherein the semiconductor substrate material is one or more selected from silicon, aluminium, an aluminium-copper alloy, tantalum, nickel, tungsten, cobalt, molybdenum, titanium, zirconium, ruthenium, hafnium, platinum, silicon-germanium, germanium, and an oxide, a nitride and a carbide thereof.

7. A method for treating a surface of a semiconductor substrate by bringing a liquid composition into contact with the semiconductor substrate to form an alcohol-repellent film on the semiconductor substrate, the method comprising the steps of: bringing the surface of the semiconductor material into contact with a liquid composition containing 0.01-15% by mass of a surfactant (A) shown below and 0.0001-20% by mass of a compound (B) shown below having a weight-average molecular weight of 200-500000 and having 4-30 mmol of an amino group per gram.

Surfactant (A): a surfactant having a substituent represented by General formula (1) below and an anionic hydrophilic group.

Compound (B): Polyethylenimine or a compound having a substituent represented by General formula (2) or (3) below.

8. The method for treating a surface of a semiconductor substrate according to Item 7, wherein the alcohol-repellency is isopropyl alcohol-repellency.

9. The method for treating a surface of a semiconductor substrate according to Item 7, wherein the semiconductor substrate is one or more selected from silicon, aluminium, an aluminium-copper alloy, tantalum, nickel, tungsten, cobalt, molybdenum, titanium, zirconium, ruthenium, hafnium, platinum, silicon-germanium, germanium, and an oxide, a nitride and a carbide thereof.

Advantageous Effects of Invention

In a preferable aspect of the present invention, a liquid composition and a method for treating a surface of a semiconductor substrate of the present invention can be used to prevent collapse of various material patterns having a high aspect ratio formed on a semiconductor substrate during a process of fabricating a semiconductor device, and thus being capable of manufacturing a high precision and high quality semiconductor device at high yield.

DESCRIPTION OF EMBODIMENTS

The liquid composition of the present invention is a liquid composition containing a surfactant (A) having a substituent represented by Formula (1) and an anionic hydrophilic group, and a compound (B) selected from the group consisting of a compound having a substituent represented by Formula (2) or (3) and polyethylenimine.

Specifically, a liquid composition of the present invention is a liquid composition for imparting alcohol-repellency to a semiconductor substrate material, comprising:

0.01-15% by mass of a surfactant (A) having a substituent represented by Formula (1):

[Chemical formula 12]

$C_nF_{2n+1}-$ (1)

where, n is an integer of 3-20, and an anionic hydrophilic group; and 0.0001-20% by mass of a compound (B) having a weight-average molecular weight of 200-500000 and having 4-30 mmol of an amino group per gram, selected from the group consisting of polyethylenimine and a compound having a substituent represented by Formula (2) or (3):

[Chemical formula 13]

(2)

where, $R^1$ and $R^2$ each independently represent hydrogen or a C1-6 alkyl, alkenyl, alkynyl or aryl group,

[Chemical formula 14]

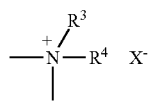
(3)

where, $R^3$ and $R^4$ each independently represent hydrogen or a C1-6 alkyl, alkenyl, alkynyl or aryl group, and $X^-$ represents a fluoride ion, a chloride ion, a bromide ion, an iodide ion, a fluoroborate ion, a phosphate ion, an acetate ion, a trifluoroacetate ion, a sulfate ion, a hydrogen sulfate ion, a methane sulfate ion, a hydroxide ion, a perchlorate ion or a nitrate ion.

Although the mechanism of how the liquid composition of the present invention imparts alcohol-repellency to a surface of a semiconductor substrate is not clear, a surfactant (A) having a substituent represented by Formula (1) and an anionic hydrophilic group, and a compound (B) selected from the group consisting of a compound having a substituent represented by Formula (2) or (3) and polyethylenimine, which are used in the liquid composition of the present invention, are considered to adsorb and manifest alcohol-repellency on the surface of the semiconductor substrate material. The alcohol-repellency in this case is evaluated to be acceptable when the contact angle between alcohol and a material surface treated by making contact with the liquid composition of the present invention is 30° or more.

The anionic hydrophilic group of the surfactant (A) used with the present invention has a structure represented by Formula (4), (5), (6) or (7):

[Chemical formula 15]

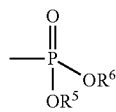
(4)

where, $R^5$ and $R^6$ each independently represent hydrogen or a C1-6 alkyl, alkenyl, alkynyl or aryl group,

[Chemical formula 16]

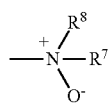
(5)

where, $R^7$ and $R^8$ each independently represent hydrogen or a C1-6 alkyl, alkenyl, alkynyl or aryl group,

[Chemical formula 17]

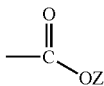
(6)

where, Z represents a metal, hydrogen or a quaternary amine,

[Chemical formula 18]

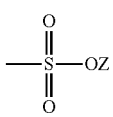
(7)

where, Z represents a metal, hydrogen or a quaternary amine.

In a preferable aspect of the present invention, $R^5$, $R^6$, $R^7$ and $R^8$ in the formulae shown above each independently represent hydrogen or a C1-6 alkyl group, preferably a methyl group, an ethyl group or a propyl group, and more preferably hydrogen.

Moreover, Z is preferably hydrogen or a quaternary amine and more preferably hydrogen.

In the surfactant (A) having a substituent represented by Formula (1) and an anionic hydrophilic group used with the present invention, the minimum value of the carbon number n of the substituent represented by Formula (1) is 3 or higher, preferably 4 or higher and particularly preferably 6 or higher, while the maximum value is 20 or lower, preferably 12 or lower and particularly preferably 8 or lower.

The concentration range of the surfactant (A) having a substituent represented by Formula (1) and an anionic hydrophilic group in the liquid composition of the present invention is 0.01-20% by mass, preferably 0.05% by mass and more preferably 0.1% by mass or more, and preferably 15% by mass or less and more preferably 5% by mass or less. In particular, the concentration range of the surfactant (A) in the liquid composition of the present invention is preferably 0.05-15% by mass and more preferably 0.1-5% by mass.

Furthermore, if solubility of these compounds in water is insufficient and phase separation occurs, an organic solvent such as an alcohol may be added. Also, a commonly used acid or alkali may be added to complement solubility. Even if no phase separation but simply clouding occurs, they may be used within a range that does not impair the effect of the treatment liquid or they may be used with stirring to give a homogenous treatment liquid. Moreover, in order to avoid clouding of the treatment liquid, an organic solvent such as an alcohol, acid or alkali may be added before use as described above.

Examples of the surfactant (A) having a substituent represented by Formula (1) and an anionic hydrophilic group used with the present invention include, but not limited to, N,N-diethyl-N',N'-bis(2-hydroxy-3-perfluorohexylpropyl)propane-1,3-diaminedioxide, N,N-diethyl-N',N'-bis(2-hydroxy-3-perfluoropentylpropyl)propane-1,3-diaminedioxide, N,N-diethyl-N',N'-bis(2-hydroxy-3-perfluorobutylpropyl)propane-1,3-diaminedioxide, N,N-dimethyl-N',N'-bis(2-hydroxy-3-perfluorohexylpropyl)propane-1,3-diaminedioxide, N,N-dimethyl-N',N'-bis(2-hydroxy-3-perfluoropentylpropyl)propane-1,3-diaminedioxide, N,N-dimethyl-N',N'-bis(2-hydroxy-3-perfluorobutylpropyl)propane-1,3-diaminedioxide, perfluorohexadecanoic acid, perfluoropentadecanoic acid, perfluorotetradecanoic acid, perfluorotridecanoic acid, perfluorododecanoic acid, perfluoroundecanoic acid, perfluorodecanoic acid, perfluorononanoic acid, perfluorooctanoic acid, perfluoroheptanoic acid, perfluorohexanoic acid, perfluoropentanoic acid, perfluorobutanoic acid, perfluorooctanesulfonic acid, perfluoroheptanesulfonic acid, perfluorohexanesulfonic acid, perfluoropentanesulfonic acid, perfluorobutanesulfonic acid, perfluoropropanesulfonic acid, perfluorooctylphosphonic acid, perfluoroheptylphosphonic acid, perfluorohexylphosphonic acid, perfluoropentylphosphonic acid, perfluorobutylphosphonic acid, perfluoropropylphosphonic acid, (1H,1H,2H,2H-perfluorodecyl)phosphonic acid, (1H,1H,2H,2H-perfluorononyl)phosphonic acid, (1H,1H,2H,2H-perfluorooctyl)phosphonic acid, (1H,1H,2H,2H-perfluoroheptyl)phosphonic acid, (1H,1H,2H,2H-perfluorohexyl) phosphonic acid, (1H,1H,2H,2H-perfluoropentyl) phosphonic acid, compounds represented by Formulae (8)-(11):

[Chemical formula 19]

$$[CF_3(CF_2)_m(CH_2)_2OCH_2CH(OH)CH_2O]_2(O)POH \quad (8)$$

where m is an integer of 2-7,

[Chemical formula 20]

$$[CF_3(CF_2)_kCH(OH)CH_2]_2(O)POH \quad (9)$$

where k is an integer of 2-7,

[Chemical formula 21]

$$[CF_3(CF_2)_j(CH_2)_2OCH_2CH(OH)CH_2O](O)P(OH)_2 \quad (10)$$

where j is an integer of 2-7,

[Chemical formula 22]

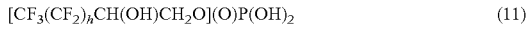

$$[CF_3(CF_2)_hCH(OH)CH_2O](O)P(OH)_2 \quad (11)$$

where h is an integer of 2-7,
and metal salts and ammonium salts thereof.
Compounds other than these may be used as long as the objective of the present invention can be achieved.

One type of surfactant (A) may be used alone, or two or more types of surfactants (A) may be used in combination.

The compound (B) selected from the group consisting of a compound having a substituent represented by Formula (2) or (3) and polyethylenimine used with the present invention has 4-30 mmol of an amino group per gram of the compound. The term "amino group" used herein refers to an amino group represented by Formula (2) or (3). The minimum value of the amino group in the compound (B) is preferably 5 mmol or more and particularly preferably 6 mmol or more per gram of the compound, while the maximum value is preferably 28 mmol or less and particularly preferably 25 mmol or less per gram of the compound, although the maximum value is not particularly required.

The minimum value of the weight-average molecular weight of the compound having a substituent represented by Formula (2) or (3) or polyethylenimine used with the present invention is 200 or more and preferably 300 or more, while the maximum value is 500000 or less and preferably 200000 or less, although the maximum value is not particularly required. Herein, the term "weight-average molecular weight" refers to a weight-average molecular weight in terms of polystyrene standard as determined by gel permeation chromatography (GPC).

The concentration range of the compound (B) selected from the group consisting of the compound having a substituent represented by Formula (2) or (3) and polyethylenimine used with the present invention is 0.0001-20% by mass, preferably 0.001% by mass or more, more preferably 0.01% by mass or more, and preferably 10% by mass or less and more preferably 5% by mass or less, in total. In particular, the concentration range of the compound (B) in the liquid composition of the present invention is preferably 0.001-10% by mass and more preferably 0.01-5% by mass in total.

Furthermore, if solubility of these compounds in water is insufficient and phase separation occurs, an organic solvent such as an alcohol may be added. Also, a commonly used acid or alkali may be added to complement solubility. Even if no phase separation but simply clouding occurs, they may be used within a range that does not impair the effect of the treatment liquid or they may be used with stirring to give a homogenous treatment liquid. Moreover, in order to avoid clouding of the treatment liquid, an organic solvent such as an alcohol, acid or alkali may be added before use as described above.

Examples of the compound (B) having a weight-average molecular weight of 200-500000, having 4-30 mmol of an amino group per gram, and having a substituent represented by Formula (2) or (3) include, but not limited to, homopolymers and copolymers having, as a starting material monomer, one or more compounds selected from prop-2-en-1-amine, N-methylprop-2-en-1-amine, N,N-dimethylprop-2-en-1-amine, N-ethylprop-2-en-1-amine, N-ethyl-N-methylprop-2-en-1-amine, N,N-diethylprop-2-en-1-amine, 2-methylprop-2-en-1-amine, N,2-dimethylprop-2-en-1-amine, N,N,2-trimethylprop-2-en-1-amine, N-ethyl-2-methylprop-2-en-1-amine, N-ethyl-N,2-dimethylprop-2-en-1-amine, N,N-diethyl-2-methylprop-2-en-1-amine, but-2-en-1-amine, N-methylbut-2-en-1-amine, N,N-dimethylbut-2-en-1-amine, N-ethylbut-2-en-1-amine, N-ethyl-N-methylbut-2-en-1-amine, N,N-diethylbut-2-en-1-amine, 2-methylbut-2-en-1-amine, N,2-dimethylbut-2-en-1-amine, N,N,2-trimethylbut-2-en-1-amine, N-ethyl-2-methylbut-2-en-1-amine, N-ethyl-N,2-dimethylbut-2-en-1-amine, N,N-diethyl-2-methylbut-2-en-1-amine, 2,3-dimethylbut-2-en-1-amine, N,2,3-trimethylbut-2-en-1-amine, N,N,2,3-tetramethylbut-2-en-1-amine, N-ethyl-2,3-dimethylbut-2-en-1-amine, N-ethyl-N,2,3-trimethylbut-2-en-1-amine, N,N-diethyl-2,3-dimethylbut-2-en-1-amine, diallylamine, N-allyl-N-methylprop-2-en-1-amine, N-allyl-N-ethylprop-2-en-1-amine, N-allyl-N,N-dimethylprop-2-en-1-amine, and a hydrochloride, a sulfate, a phosphate, a nitrate or a sulfur dioxide thereof. Compounds other than these may be used as long as the objective of the present invention can be achieved.

In particular, the compound (B) is preferably a homopolymer or a copolymer having, as the starting material monomer, one or more compounds selected from prop-2-en-1-amine, N,N-dimethylprop-2-en-1-amine, diallylamine, and a hydrochloride, a sulfate, a phosphate, a nitrate or a sulfur dioxide thereof.

One type of compound (B) may be used alone, or two or more types of compounds (B) may be used in combination.

The liquid composition of the present invention can be used to treat and impart alcohol-repellency to a surface of various materials constituting semiconductor substrates. The alcohol against which the liquid composition of the present invention can exhibit alcohol-repellency is, but not particularly limited to, preferably methanol, ethanol, 1-butanol, 1-propanol, IPA and the like, and particularly preferably IPA.

Examples of the material of the semiconductor substrate to which alcohol-repellency is imparted by surface treatment with the liquid composition of the present invention preferably include, but not limited to, those using one or more of silicon, aluminium, an aluminium-copper alloy, tantalum, nickel, tungsten, cobalt, molybdenum, titanium, zirconium, ruthenium, hafnium, platinum, silicon-germanium, germanium or an oxide, a nitride or a carbide thereof.

The liquid composition of the present invention contains a solvent (remnant) in addition to the surfactant (A) and the compound (B). Examples of the solvent include water, an alcohol or a combination thereof. The alcohol preferably comprises methanol, ethanol, 1-butanol, 1-propanol, IPA, ethylene glycol, propylene glycol, glycerin, diethylene glycol, xylitol, sorbitol, diethylene glycol monomethyl ether, diethylene glycol monoethyl ether, diethylene glycol monobutyl ether and dipropylene glycol monopropyl ether, and particularly preferably comprises IPA.

If desired, the liquid composition of the present invention may be added with an additive conventionally used in a liquid composition for a semiconductor within a range that does not impair the objective of the present invention. For example, a defoamer or the like can be added.

The liquid composition of the present invention can be brought into contact with a semiconductor substrate to impart alcohol-repellency to the semiconductor substrate.

A method for bringing the liquid composition of the present invention into contact with a semiconductor substrate is not particularly limited. For example, a method in which a semiconductor substrate is immersed in the liquid composition of the present invention, a method in which the liquid composition is allowed to make contact with a semiconductor substrate by dropping or spraying, or the like can be employed.

The temperature at which the liquid composition of the present invention is used is preferably in a range of 20-80° C. and more preferably in a range of 25-70° C., which may appropriately be determined according to the semiconductor substrate used.

The contact time with the liquid composition of the present invention is preferably in a range of 0.3-20 minutes and more preferably in a range of 0.5-10 minutes, which may appropriately be determined according to the semiconductor substrate used.

After bringing the liquid composition of the present invention into contact with a semiconductor substrate, the excessive liquid composition is preferably removed with an alcohol such as IPA. In addition, the alcohol remaining on the surface is preferably removed, for example, by blowing dry gas. Accordingly, a semiconductor substrate can be imparted with alcohol-repellency.

EXAMPLES

Hereinafter, the present invention will be described more specifically by way of examples and comparative examples. The present invention, however, should not be limited in any way to these examples.

<Contact Angle Meter>

Contact angles were measured with Contact Angle Meter Model DM701 from Kyowa Interface Science Co., Ltd. at a temperature of 21-28° C. and a humidity of 40-60%.

<Experimental Operation>

Hereinafter, the experimental operations of Examples and Comparative examples will be described.

A silicon wafer having a film formed from a semiconductor substrate material was immersed into a liquid composition shown in Table 2, 4, 7, 9 or 12 (immersing temperature and immersing time are respectively shown in Tables 3, 5, 8, 10 and 13), and then the excessive liquid composition was rinsed off with isopropyl alcohol (IPA). IPA left on the surface was blown off with dry nitrogen gas. The contact angle between the surface-treated substrate material and IPA was measured, where an angle of 30 degrees or more was regarded acceptable.

Example 1

The liquid composition (2A) including 1% by mass of N,N-diethyl-N',N'-bis(2-hydroxy-3-perfluorohexylpropyl)propane-1,3-diamine oxide, 1% by mass of PAS-92 (from Nittobo Medical Co., Ltd. a diallylamine hydrochloride-sulfur dioxide copolymer [secondary amine/SO$_2$], weight-average molecular weight 5000) and 98% by mass of water was used to immerse a silicon nitride substrate at 25° C. for 10 minutes, which was then rinsed with IPA and dried. IPA was dropped onto this substrate to measure the contact angle therebetween. The contact angle was 38 degrees and thus found acceptable (see Table 3).

Examples 2-37

As can be appreciated from Table 3, all of the substrate materials whose surfaces had been treated with the liquid compositions shown in Table 2 in the same manner as Example 1, had contact angles of 30 degrees or more with IPA, showing that they had alcohol-repellency.

Comparative Example 1

The substrate material whose surface had been treated with the liquid composition 4A shown in Table 4 had a contact angle of less than 30 degrees with IPA, showing that, even if a compound having a substituent represented by Formula (2) or (3) was contained, the treated substrate material would not exhibit alcohol-repellency if the proportion of the amino group was less than 4 mmol.

Comparative Example 2

The substrate material whose surface had been treated with the liquid composition 4B shown in Table 4 had a contact angle of less than 30 degrees with IPA, showing that, even if a compound having a substituent represented by Formula (2) or (3) was contained, the treated substrate material would not exhibit alcohol-repellency if the weight-average molecular weight was less than 200.

Comparative examples 3 and 4

The substrate materials whose surfaces had been treated with the liquid compositions 4C and 4D shown in Table 4 had contact angles of less than 30 degrees with IPA, showing that 36 the substrate material treated with a liquid composition that did not contain a surfactant having an anionic hydrophilic group represented by any one of Formulae (4)-(7) would not exhibit alcohol-repellency.

Comparative Example 5

The substrate material whose surface had been treated with the liquid composition 4E shown in Table 4 had a contact angle of less than 30 degrees with IPA, showing that the treated substrate material did not exhibit alcohol-repellency if n of the substituent represented by Formula (1) was less than 3.

Comparative Examples 6-11

The substrate materials whose surfaces had been treated with the liquid compositions 4F-4K shown in Table 4 had contact angles of less than 30 degrees with IPA, showing that the treated substrate material would not exhibit alcohol-repellency if the liquid composition did not contain a compound having a substituent represented by Formula (2) or (3) or polyethylenimine.

Comparative Examples 12-22

The substrate materials whose surfaces had been treated with the liquid compositions 4L-4V shown in Table 4 had contact angles of less than 30 degrees with IPA, showing that the treated substrate material would not exhibit alcohol-repellency if the liquid composition did not contain a surfactant having a substituent represented by Formula (1) and an anionic hydrophilic group.

Comparative Examples 23-42

The effects of the silane-based compounds having an alkyl group described in Patent Literatures 1, 2 and 3 were compared with the effect of the present invention. Since some of the contact angles between the substrate materials whose surfaces had been treated with the liquid compositions 7A-7D shown in Table 7 and water were large, some surfaces were found to be modified. The contact angle with IPA, however, was less than 30 degrees, and none of the treated substrate materials had alcohol-repellency.

Comparative Examples 43-50

The effect of the silane-based compound having a fluorine-containing alkyl group described in Patent Literature 4 was compared with the effect of the present invention. According to the invention described in Patent Literature 4, either or both of a silane-based compound having a fluorine-containing alkyl group and an acid catalyst are micro-encapsulated and mixed, to apply the resultant to a base material surface while breaking the microcapsules. By doing so, the silane-based compound can be prevented from decomposing during the course from blending to application. Therefore, the effect of the invention described in Patent Literature 4 was considered to be reproducible without micro-encapsulation by mixing a silane-based compound and an acid catalyst and immediately using the same for treating a substrate material. The substrate material whose surface had been treated with the liquid composition 9A shown in Table 9 had a contact angle of less than 30 degrees with IPA, and none of the treated substrate materials had alcohol-repellency.

Comparative Examples 51-54

The effect of a fluorine-based coating agent was compared with the effect of the present invention. The respective compounds, a polymerization solvent and an initiator were fed into a sealed vessel to the concentrations shown in Table 11, and allowed to react at 70° C. for more than 18 hours to obtain a polymer 11A. Subsequently, the polymer 11A was diluted with a solvent to give the concentration shown in Table 12, thereby obtaining the liquid composition 12A. The substrate material whose surface had been treated with the liquid composition 12A shown in Table 12 had a contact angle of less than 30 degrees with IPA, and none of the treated substrates materials had alcohol-repellency.

TABLE 1

Surfactant

| Type | Name/Structure |
|---|---|
| 1A | N,N-Diethyl-N',N'-bis(2-hydroxy-3-perfluorohexylpropyl)propane-1,3-diamine oxide |
| 1B | $[CF_3(CF_2)_5(CH_2)_2OCH_2CH(OH)CH_2O]_2(O)POH$ |
| 1C | Perfluoroheptanoic acid |
| 1D | Perfluorobutanesulfonic acid |
| 1E | (1H,1H,2H,2H-Perfluorodecyl)phosphonic acid |
| 1F | Perfluorododecanoic acid |
| 1G | Perfluorohexadecanoic acid |
| 1H | Perfluoroheptanol |
| 1I | Perfluorohexylamine |
| 1J | Perfluoropropionic acid |

TABLE 2

| Liquid composition | Surfactant (A) | | Compound (B) | | | | IPA | Water |
|---|---|---|---|---|---|---|---|---|
| | Type | Concentration % by mass | Type | Weight-average molecular weight | Proportion of amino group*1 | Concentration % by mass | Concentration % by mass | Concentration % by mass |
| 2A | 1A | 1 | PAS-92 | 5000 | 5 | 1 | 0 | 98 |
| 2B | 1B | 1 | PAA-01 | 1600 | 18 | 1 | 40 | 58 |
| 2C | 1B | 1 | PAA-08 | 8000 | 18 | 1 | 40 | 58 |
| 2D | 1B | 1 | PAA-HCL-05 | 5000 | 11 | 1 | 40 | 58 |
| 2E | 1B | 1 | PAA-1112 | 1000 | 14 | 1 | 40 | 58 |
| 2F | 1B | 1 | PAS-H-1L | 8500 | 7 | 1 | 40 | 58 |
| 2G | 1B | 1 | Polyethylenimine | 300 | 21 | 1 | 40 | 58 |
| 2H | 1B | 1 | Polyethylenimine | 300 | 21 | 0.001 | 40 | 59 |
| 2I | 1B | 1 | Polyethylenimine | 300 | 21 | 10 | 40 | 49 |
| 2J | 1B | 0.05 | Polyethylenimine | 300 | 21 | 1 | 40 | 59 |
| 2K | 1B | 10 | Polyethylenimine | 300 | 21 | 1 | 40 | 49 |
| 2L | 1B | 1 | Polyethylenimine | 300 | 21 | 1 | 98 | 0 |
| 2M | 1B | 1 | Polyethylenimine | 1800 | 21 | 1 | 98 | 0 |
| 2N | 1B | 1 | Polyethylenimine | 70000 | 21 | 1 | 98 | 0 |
| 2O | 1C | 1 | PAS-92 | 5000 | 5 | 1 | 0 | 98 |
| 2P | 1C | 1 | PAS-H-1L | 8500 | 7 | 1 | 0 | 98 |
| 2Q | 1D | 1 | PAS-H-10L | 200000 | 7 | 1 | 0 | 98 |

TABLE 2-continued

| Liquid composition | Surfactant (A) | | Compound (B) | | | IPA Concentration % by mass | Water Concentration % by mass |
| --- | --- | --- | --- | --- | --- | --- | --- |
| | Type | Concentration % by mass | Type | Weight-average molecular weight | Proportion of amino group*1 | Concentration % by mass | |
| 2R | 1E | 1 | PAA-03 | 3000 | 18 | 1 | 0 | 98 |
| 2S | 1F | 1 | PAA-03 | 3000 | 18 | 1 | 0 | 98 |
| 2T | 1G | 1 | PAA-03 | 3000 | 18 | 1 | 0 | 98 |

*1Proportion of amino group: mmol of amino group contained per gram of compound
PAA-01 from Nittobo Medical Co., Ltd: Allylamine (free) polymer [Homopolymer of primary amine], weight-average molecular weight 1600
PAA-03 from Nittobo Medical Co., Ltd: Allylamine (free) polymer [Homopolymer of primary amine], weight-average molecular weight 3000
PAA-08 from Nittobo Medical Co., Ltd: Allylamine (free) polymer [Homopolymer of primary amine], weight-average molecular weight 8000
PAA-HCL-05 from Nittobo Medical Co., Ltd: Allylamine hydrochloride polymer [Homopolymer of primary amine], weight-average molecular weight 5000
PAA-1112 from Nittobo Medical Co., Ltd: Allylamine-dimethylallylamine (free) copolymer [Primary/tertiary amine], weight-average molecular weight 1000
PAS-H-1L from Nittobo Medical Co., Ltd: Diallyldimethyl ammonium chloride polymer [Homopolymer of quaternary amine], weight-average molecular weight 8500
PAS-H-10L from Nittobo Medical Co., Ltd: Diallyldimethyl ammonium chloride polymer [Homopolymer of quaternary amine], weight-average molecular weight 200,000
PAS-92 from Nittobo Medical Co., Ltd: Diallylamine hydrochloride-sulfur dioxide copolymer [Secondary amine/$SO_2$], weight-average molecular weight 5000
Polyethylenimine from Nippon Shokubai Co. Ltd: Ethyleneimine polymer, weight-average molecular weight 300
Polyethylenimine from Nippon Shokubai Co. Ltd: Ethyleneimine polymer, weight-average molecular weight 1800
Polyethylenimine from Nippon Shokubai Co. Ltd: Ethyleneimine polymer, weight-average molecular weight 70000

TABLE 3

| Example | Liquid composition | Substrate material | Temperature/° C. | Immersing time/min | IPA contact angle/degree |
| --- | --- | --- | --- | --- | --- |
| 1 | 2A | Silicon nitride | 25 | 10 | 38 |
| 2 | 2B | Silicon nitride | 25 | 2 | 53 |
| 3 | 2C | Silicon nitride | 25 | 2 | 61 |
| 4 | 2D | Silicon nitride | 25 | 2 | 60 |
| 5 | 2E | Silicon nitride | 25 | 2 | 56 |
| 6 | 2F | Silicon nitride | 25 | 2 | 51 |
| 7 | 2G | Silicon nitride | 25 | 2 | 36 |
| 8 | 2G | Silicon nitride | 25 | 10 | 45 |
| 9 | 2G | Aluminum oxide | 25 | 2 | 47 |
| 10 | 2G | Aluminium-copper alloy | 25 | 2 | 52 |
| 11 | 2G | Tantalum | 25 | 2 | 44 |
| 12 | 2G | Nickel | 25 | 2 | 49 |
| 13 | 2G | Tantalum nitride | 25 | 2 | 47 |
| 14 | 2G | Tungsten oxide | 25 | 2 | 54 |
| 15 | 2G | Tungsten | 25 | 2 | 49 |
| 16 | 2G | Cobalt | 25 | 2 | 51 |
| 17 | 2G | Molybdenum | 25 | 2 | 55 |
| 18 | 2G | Titanium nitride | 25 | 2 | 39 |
| 19 | 2G | Silicon oxide | 25 | 2 | 52 |
| 20 | 2G | Silicon | 25 | 2 | 55 |
| 21 | 2H | Silicon nitride | 25 | 10 | 35 |
| 22 | 2I | Silicon nitride | 25 | 10 | 36 |
| 23 | 2J | Silicon nitride | 25 | 10 | 40 |
| 24 | 2K | Silicon oxide | 25 | 10 | 44 |
| 25 | 2L | Silicon oxide | 25 | 10 | 40 |
| 26 | 2M | Silicon nitride | 25 | 2 | 45 |
| 27 | 2N | Silicon nitride | 25 | 2 | 41 |
| 28 | 2O | Silicon nitride | 25 | 10 | 40 |
| 29 | 2P | Silicon nitride | 25 | 10 | 32 |
| 30 | 2Q | Silicon nitride | 25 | 10 | 33 |
| 31 | 2R | Silicon nitride | 25 | 10 | 52 |
| 32 | 2S | Silicon oxide | 25 | 0.25 | 34 |
| 33 | 2S | Silicon oxide | 25 | 1 | 46 |
| 34 | 2S | Silicon oxide | 25 | 10 | 54 |
| 35 | 2S | Silicon oxide | 25 | 30 | 43 |
| 36 | 2S | Silicon oxide | 25 | 60 | 52 |
| 37 | 2S | Silicon oxide | 60 | 10 | 48 |
| 38 | 2S | Silicon oxide | 80 | 10 | 49 |
| 39 | 2T | Silicon nitride | 25 | 10 | 51 |

TABLE 4

| Liquid composition | Surfactant | | Compound | | | IPA Concentration % by mass | Water Concentration % by mass |
| --- | --- | --- | --- | --- | --- | --- | --- |
| | Type | Concentration % by mass | Type | Weight-average molecular weight | Proportion of amino group *1 | Concentration % by mass | |
| 4A | 1C | 1 | PAS-2401 | 2000 | 3 | 1 | 0 | 98 |
| 4B | 1C | 1 | N,N'-Bis(3-aminopropyl)ethylenediamine | 174 | 23 | 1 | 0 | 98 |
| 4C | 1H | 1 | Polyethylenimine | 300 | 21 | 1 | 0 | 98 |
| 4D | 1I | 1 | Polyethylenimine | 300 | 21 | 1 | 0 | 98 |
| 4E | 1J | 1 | Polyethylenimine | 300 | 21 | 1 | 0 | 98 |
| 4F | 1A | 1 | | | | | 0 | 99 |
| 4G | 1B | 1 | | | | | 40 | 59 |
| 4H | 1C | 1 | | | | | 0 | 99 |
| 4I | 1D | 1 | | | | | 0 | 99 |
| 4J | 1E | 1 | | | | | 0 | 99 |
| 4K | 1F | 1 | | | | | 0 | 99 |
| 4L | | | PAS-92 | 5000 | 5 | 1 | 0 | 99 |
| 4M | | | PAA-01 | 1600 | 18 | 1 | 0 | 99 |
| 4N | | | PAA-03 | 3000 | 18 | 1 | 0 | 99 |
| 4O | | | PAA-08 | 8000 | 18 | 1 | 0 | 99 |
| 4P | | | PAA-HCL-05 | 5000 | 11 | 1 | 0 | 99 |
| 4Q | | | PAA-1112 | 1000 | 14 | 1 | 0 | 99 |

TABLE 4-continued

| Liquid composition | Surfactant | | Compound | | | | IPA | Water |
|---|---|---|---|---|---|---|---|---|
| | Type | Concentration % by mass | Type | Weight-average molecular weight | Proportion of amino group *1 | Concentration % by mass | Concentration % by mass | Concentration % by mass |
| 4R | | | PAS-H-1L | 8500 | 7 | 1 | 0 | 99 |
| 4S | | | PAS-H-10L | 200000 | 7 | 1 | 0 | 99 |
| 4T | | | Polyethylenimine | 300 | 21 | 1 | 0 | 99 |
| 4U | | | Polyethylenimine | 1800 | 21 | 1 | 0 | 99 |
| 4V | | | Polyethylenimine | 70000 | 21 | 1 | 0 | 99 |

PAS-2401 from Nittobo Medical Co., Ltd: Diallylmethyl ethyl ammonium ethyl sulfate-sulfur dioxide copolymer [Quaternary amine/SO$_2$]

TABLE 5

| Comparative example | Liquid composition | Substrate material | Temperature/°C. | Immersing time/min | IPA contact angle/degree |
|---|---|---|---|---|---|
| 1 | 4A | Silicon nitride | 25 | 10 | <10 |
| 2 | 4B | Silicon nitride | 25 | 10 | <10 |
| 3 | 4C | Silicon nitride | 25 | 10 | <10 |
| 4 | 4D | Silicon nitride | 25 | 10 | <10 |
| 5 | 4E | Silicon nitride | 25 | 10 | <10 |
| 6 | 4F | Silicon nitride | 25 | 10 | <10 |
| 7 | 4G | Silicon nitride | 25 | 10 | 28 |
| 8 | 4H | Silicon nitride | 25 | 10 | <10 |
| 9 | 4I | Silicon nitride | 25 | 10 | <10 |
| 10 | 4J | Silicon nitride | 25 | 10 | 20 |
| 11 | 4K | Silicon nitride | 25 | 10 | <10 |
| 12 | 4L | Silicon nitride | 25 | 10 | <10 |
| 13 | 4M | Silicon nitride | 25 | 10 | <10 |
| 14 | 4N | Silicon nitride | 25 | 10 | <10 |
| 15 | 4O | Silicon nitride | 25 | 10 | <10 |
| 16 | 4P | Silicon nitride | 25 | 10 | <10 |
| 17 | 4Q | Silicon nitride | 25 | 10 | <10 |
| 18 | 4R | Silicon nitride | 25 | 10 | <10 |
| 19 | 4S | Silicon nitride | 25 | 10 | <10 |
| 20 | 4T | Silicon nitride | 25 | 10 | <10 |
| 21 | 4U | Silicon nitride | 25 | 10 | <10 |
| 22 | 4V | Silicon nitride | 25 | 10 | <10 |

TABLE 6

| Silane-based compound | |
|---|---|
| Type | Name |
| 6A | Hexamethyldisilazane |
| 6B | Octyldimethylsilyl dimethylamine |
| 6C | Trimethylsilyl dimethylamine |
| 6D | Tetramethylsilane |
| 6E | Perfluorodecyl trimethoxysilane |

TABLE 7

| Liquid composition | Silane-based compound | | Toluene |
|---|---|---|---|
| | Type | Concentration mass % | Concentration mass % |
| 7A | 6A | 1 | 99 |
| 7B | 6B | 1 | 99 |
| 7C | 6C | 1 | 99 |
| 7D | 6D | 1 | 99 |

TABLE 8

| Comparative example | Liquid composition | Substrate material | Temperature/°C. | Immersing time/min | Water contact angle/degree | IPA contact angle/degree |
|---|---|---|---|---|---|---|
| 23 | 7A | Silicon oxide | 25 | 2 | 19 | <10 |
| 24 | 7B | Silicon oxide | 25 | 2 | 89 | <10 |
| 25 | 7B | Silicon nitride | 25 | 2 | 83 | <10 |
| 26 | 7C | Silicon oxide | 25 | 2 | 68 | <10 |
| 27 | 7D | Silicon oxide | 25 | 2 | <10 | <10 |
| 28 | 7A | Silicon oxide | 60 | 2 | 42 | <10 |
| 29 | 7B | Silicon oxide | 60 | 2 | 101 | <10 |
| 30 | 7B | Silicon nitride | 60 | 2 | 93 | <10 |
| 31 | 7C | Silicon oxide | 60 | 2 | 77 | <10 |
| 32 | 7D | Silicon oxide | 60 | 2 | 20 | <10 |
| 33 | 7A | Silicon oxide | 25 | 10 | 20 | <10 |
| 34 | 7B | Silicon oxide | 25 | 10 | 99 | <10 |
| 35 | 7B | Silicon nitride | 25 | 10 | 82 | <10 |
| 36 | 7C | Silicon oxide | 25 | 10 | 83 | <10 |
| 37 | 7D | Silicon oxide | 25 | 10 | <10 | <10 |
| 38 | 7A | Silicon oxide | 60 | 10 | 53 | <10 |
| 39 | 7B | Silicon oxide | 60 | 10 | 104 | <10 |
| 40 | 7B | Silicon nitride | 60 | 10 | 90 | <10 |
| 41 | 7C | Silicon oxide | 60 | 10 | 90 | <10 |
| 42 | 7D | Silicon oxide | 60 | 10 | 34 | <10 |

TABLE 9

| Liquid composition | Silane-based compound | | Acid catalyst | | Solvent | |
|---|---|---|---|---|---|---|
| | Type | Concentration mass % | Type | Concentration mass % | Type | Concentration mass % |
| 9A | 6E | 1 | Sulfuric acid | 3 | Water | 96 |

TABLE 10

| Comparative example | Liquid composition | Substrate material | Temperature/°C. | Immersing time/min | Water contact angle/degree | IPA contact angle/degree |
|---|---|---|---|---|---|---|
| 43 | 9A | Silicon oxide | 25 | 2 | 110 | <10 |
| 44 | 9A | Silicon nitride | 25 | 2 | 41 | <10 |
| 45 | 9A | Silicon oxide | 60 | 2 | 110 | <10 |
| 46 | 9A | Silicon nitride | 60 | 2 | 56 | <10 |
| 47 | 9A | Silicon oxide | 25 | 10 | 109 | 21 |
| 48 | 9A | Silicon nitride | 25 | 10 | 90 | <10 |
| 49 | 9A | Silicon oxide | 60 | 10 | 107 | 13 |
| 50 | 9A | Silicon nitride | 60 | 10 | 92 | <10 |

TABLE 11

| | Concentration mass % | | | | |
|---|---|---|---|---|---|
| Polymer | m-Xylene hexafluoride | Monomer Formula (13) | Monomer Formula (14) | Monomer Formula (15) | 2,2'-Azobis(dimethyl isobutyrate) |
| 11A | 50 | 9.5 | 40 | 0.50 | 0.17 |

[Chemical formula 23]

$$CH_2\!=\!CH\!-\!COO\!-\!(CH_2)_2\!-\!(CF_2)_6\!-\!F \quad (13)$$

[Chemical formula 24]

$$CH_2\!=\!C(CH_3)\!-\!COO\!-\!(CH_2)_2\!-\!(CF_2)_6\!-\!F \quad (14)$$

[Chemical formula 25]

$$CH_2\!=\!CH\!-\!COO\!-\!C_2H_4O\!-\!CO\!-\!C_2H_4\!-\!COOH \quad (15)$$

TABLE 12

| | Concentration mass % | |
|---|---|---|
| Liquid composition | m-Xylene hexafluoride | Polymer 11A |
| 12A | 85 | 15 |

TABLE 13

| Comparative example | Liquid composition | Substrate material | Temperature/°C. | Immersing time/min | IPA contact angle/degree |
|---|---|---|---|---|---|
| 51 | 12A | Silicon oxide | 25 | 2 | <10 |
| 52 | 12A | Silicon oxide | 60 | 2 | <10 |
| 53 | 12A | Silicon oxide | 25 | 10 | <10 |
| 54 | 12A | Silicon oxide | 60 | 10 | <10 |

The invention claimed is:

1. A liquid composition, comprising:
from 0.01-15% by mass of a surfactant (A) having a substituent of Formula (1):

$$C_nF_{2n+1}\!- \quad (1)$$

wherein n is an integer of 3-20, and an anionic hydrophilic group; and from 0.0001-20% by mass of a compound (B) having a weight-average molecular weight of from 200-500000 and from 4-30 mmol of an amino group per gram, selected from the group consisting of polyethylenimine and a compound having a substituent of Formula (2) or (3):

wherein $R^1$ and $R^2$ are each independently represent hydrogen or a C1-6 alkyl, alkenyl, alkynyl or aryl group,

wherein R³ and R⁴ each independently represent hydrogen or a C1-6 alkyl, alkenyl, alkynyl or aryl group, and
X⁻ represents a fluoride ion, a chloride ion, a bromide ion, an iodide ion, a fluoroborate ion, a phosphate ion, an acetate ion, a trifluoroacetate ion, a sulfate ion, a hydrogen sulfate ion, a methane sulfate ion, a hydroxide ion, a perchlorate ion or a nitrate ion, and
wherein the liquid compound is suitable for imparting alcohol-repellency to a semiconductor substrate material.

2. The liquid composition according to claim 1,
wherein the anionic hydrophilic group has a structure of Formula (4), (5), (6) or (7):

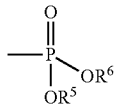
(4)

wherein R⁵ and R⁶ each independently represent hydrogen or a C1-6 alkyl, alkenyl, alkynyl or aryl group,

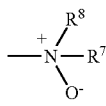
(5)

wherein R⁷ and R⁸ each independently represent hydrogen or a C1-6 alkyl, alkenyl, alkynyl or aryl group,

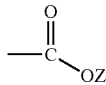
(6)

wherein Z represents a metal, hydrogen or a quaternary amine,

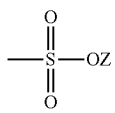
(7)

where wherein Z represents a metal, hydrogen or a quaternary amine.

3. The liquid composition according to claim 1,
wherein the compound (B) comprises a homopolymer or a copolymer comprising, as a starting material monomer, one or more compounds selected from the group consisting of: ethyleneimine, prop-2-en-1-amine, N-methylprop-2-en-1-amine, N,N-dimethylprop-2-en-1-amine, N-ethylprop-2-en-1-amine, N-ethyl-N-methylprop-2-en-1-amine, N,N-diethylprop-2-en-1-amine, 2-methylprop-2-en-1-amine, N,2-dimethylprop-2-en-1-amine, N,N,2-trimethylprop-2-en-1-amine, N-ethyl-2-methylprop-2-en-1-amine, N-ethyl-N,2-dimethylprop-2-en-1-amine, N,N-diethyl-2-methylprop-2-en-1-amine, but-2-en-1-amine, N-methylbut-2-en-1-amine, N,N-dimethylbut-2-en-1-amine, N-ethylbut-2-en-1-amine, N-ethyl-N-methylbut-2-en-1-amine, N,N-diethylbut-2-en-1-amine, 2-methylbut-2-en-1-amine, N,2-dimethylbut-2-en-1-amine, N,N,2-trimethylbut-2-en-1-amine, N-ethyl-2-methylbut-2-en-1-amine, N-ethyl-N,2-dimethylbut-2-en-1-amine, N,N-diethyl-2-methylbut-2-en-1-amine, 2,3-dimethylbut-2-en-1-amine, N,2,3-trimethylbut-2-en-1-amine, N,N,2,3-tetramethylbut-2-en-1-amine, N-ethyl-2,3-dimethylbut-2-en-1-amine, N-ethyl-N,2,3-trimethylbut-2-en-1-amine, N,N-diethyl-2,3-dimethylbut-2-en-1-amine, diallylamine, N-allyl-N-methylprop-2-en-1-amine, N-allyl-N-ethylprop-2-en-1-amine, N-allyl-N,N-dimethylprop-2-en-1-amine, a hydrochloride thereof, a sulfate thereof, a phosphate thereof, a nitrate thereof and a sulfur dioxide thereof.

4. The liquid composition according to claim 1,
wherein the surfactant (A) comprises one or more selected from the group consisting of N,N-diethyl-N',N'-bis(2-hydroxy-3-perfluorohexylpropyl)propane-1,3-diaminedioxide, N,N-diethyl-N',N'-bis(2-hydroxy-3-perfluoropentylpropyl)propan-1,3-diaminedioxide, N,N-diethyl-N',N'-bis(2-hydroxy-3-perfluorobutylpropyl)propane-1,3-diaminedioxide, N,N-dimethyl-N',N'-bis(2-hydroxy-3-perfluorohexylpropyl)propane-1,3-diaminedioxide, N,N-dimethyl-N',N'-bis(2-hydroxy-3-perfluoropentylpropyl)propane-1,3-diaminedioxide, N,N-dimethyl-N',N'-bis(2-hydroxy-3-perfluorobutylpropyl)propane-1,3-diaminedioxide, perfluorohexadecanoic acid, perfluoropentadecanoic acid, perfluorotetradecanoic acid, perfluorotridecanoic acid, perfluorododecanoic acid, perfluoroundecanoic acid, perfluorodecanoic acid, perfluorononanoic acid, perfluorooctanoic acid, perfluoroheptanoic acid, perfluorohexanoic acid, perfluoropentanoic acid, perfluorobutanoic acid, perfluorooctanesulfonic acid, perfluoroheptanesulfonic acid, perfluorohexanesulfonic acid, perfluoropentanesulfonic acid, perfluorobutanesulfonic acid, perfluoropropanesulfonic acid, perfluorooctylphosphonic acid, perfluoroheptylphosphonic acid, perfluorohexylphosphonic acid, perfluoropentylphosphonic acid, perfluorobutylphosphonic acid, perfluoropropylphosphonicacid, (1H,1H,2H,2H-perfluorodecyl)phosphonic acid, (1H,1H,2H,2H-perfluorononyl)phosphonic acid, (1H,1H,2H,2H-perfluorooctyl)phosphonic acid, (1H,1H,2H,2H-perfluoroheptyl)phosphonic acid, (1H,1H,2H,2H-perfluorohexyl)phosphonic acid, (1H,1H,2H,2H-perfluoropentyl)phosphonic acid, compounds of Formulae (8)-(11):

(8)

wherein m is an integer of from 2-7,

(9)

wherein k is an integer of 2-7,

(10)

wherein j is an integer of from 2-7, and

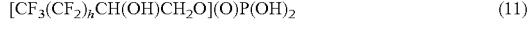
(11)

wherein h is an integer of from 2-7, a metal salt thereof and an ammonium salt thereof.

5. The liquid composition according to claim 1,
wherein the alcohol-repellency is isopropyl alcohol.

6. The liquid composition according to claim 1,
wherein the semiconductor substrate material comprises one or more selected from the group consisting of silicon, aluminium, an aluminium-copper alloy, tantalum, nickel, tungsten, cobalt, molybdenum, titanium, zirconium, ruthenium, hafnium, platinum, silicon-germanium, germanium, an oxide thereof, a nitride thereof and a carbide thereof.

7. A method for treating a surface of a semiconductor substrate the method comprising
bringing a liquid composition of claim 1 into contact with the semiconductor substrate to impart alcohol-repellency to the semiconductor substrate.

8. The method according to claim 7,
wherein the alcohol-repellency is isopropyl alcohol-repellency.

9. The method according to claim 7,
wherein the semiconductor substrate is one or more selected from the group consisting of silicon, aluminium, an aluminium-copper alloy, tantalum, nickel, tungsten, cobalt, molybdenum, titanium, zirconium, ruthenium, hafnium, platinum, silicon-germanium, germanium, an oxide thereof, a nitride thereof and a carbide thereof.

10. The method according to claim 7,
wherein the anionic hydrophilic group has a structure of Formula (4), (5), (6) or (7):

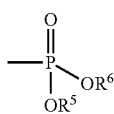
(4)

wherein $R^5$ and $R^6$ each independently represent hydrogen or a C1-6 alkyl, alkenyl, alkynyl or aryl group,

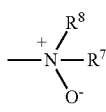
(5)

wherein $R^7$ and $R^8$ each independently represent hydrogen or a C1-6 alkyl, alkenyl, alkynyl or aryl group,

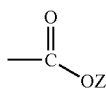
(6)

wherein Z represents a metal, hydrogen or a quaternary amine, and

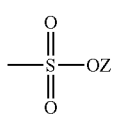
(7)

wherein Z represents a metal, hydrogen or a quaternary amine.

11. The method according to claim 7,
wherein the compound (B) comprises a homopolymer or a copolymer comprising, as a starting material monomer, one or more compounds selected from the group consisting of: ethyleneimine, prop-2-en-1-amine, N-methylprop-2-en-1-amine, N,N-dimethylprop-2-en-1-amine, N-ethylprop-2-en-1-amine, N-ethyl-N-methylprop-2-en-1-amine, N,N-diethylprop-2-en-1-amine, 2-methylprop-2-en-1-amine, N,2-dimethylprop-2-en-1-amine, N,N,2-trimethylprop-2-en-1-amine, N-ethyl-2-methylprop-2-en-1-amine, N-ethyl-N,2-dimethylprop-2-en-1-amine, N,N-diethyl-2-methylprop-2-en-1-amine, but-2-en-1-amine, N-methylbut-2-en-1-amine, N,N-dimethylbut-2-en-1-amine, N-ethylbut-2-en-1-amine, N-ethyl-N-methylbut-2-en-1-amine, N,N-diethylbut-2-en-1-amine, 2-methylbut-2-en-1-amine, N,2-dimethylbut-2-en-1-amine, N,N,2-trimethylbut-2-en-1-amine, N-ethyl-2-methylbut-2-en-1-amine, N-ethyl-N,2-dimethylbut-2-en-1-amine, N,N-diethyl-2-methylbut-2-en-1-amine, 2,3-dimethylbut-2-en-1-amine, N,2,3-trimethylbut-2-en-1-amine, N,N,2,3-tetramethylbut-2-en-1-amine, N-ethyl-2,3-dimethylbut-2-en-1-amine, N-ethyl-N,2,3-trimethylbut-2-en-1-amine, N,N-diethyl-2,3-dimethylbut-2-en-1-amine, diallylamine, N-allyl-N-methylprop-2-en-1-amine, N-allyl-N-ethylprop-2-en-1-amine, N-allyl-N,N-dimethylprop-2-en-1-amine, a hydrochloride thereof, a sulfate thereof, a phosphate thereof, a nitrate thereof and a sulfur dioxide thereof.

12. The method according to claim 7,
wherein the surfactant (A) comprises one or more selected from the group consisting of N,N-diethyl-N',N'-bis(2-hydroxy-3-perfluorohexylpropyl)propane-1,3-diaminedioxide, N,N-diethyl-N',N'-bis(2-hydroxy-3-perfluoropentylpropyl)propan-1,3-diaminedioxide, N,N-diethyl-N',N'-bis(2-hydroxy-3-perfluorobutylpropyl)propane-1,3-diaminedioxide, N,N-dimethyl-N',N'-bis(2-hydroxy-3-perfluorohexylpropyl)propane-1,3-diaminedioxide, N,N-dimethyl-N',N'-bis(2-hydroxy-3-perfluoropentylpropyl)propane-1,3-diaminedioxide, N,N-dimethyl-N',N'-bis(2-hydroxy-3-perfluorobutylpropyl)propane-1,3-diaminedioxide, perfluorohexadecanoic acid, perfluoropentadecanoic acid, perfluorotetradecanoic acid, perfluorotridecanoic acid, perfluorododecanoic acid, perfluoroundecanoic acid, perfluorodecanoic acid, perfluorononanoic acid, perfluorooctanoic acid, perfluoroheptanoic acid, perfluorohexanoic acid, perfluoropentanoic acid, perfluorobutanoic acid, perfluorooctanesulfonic acid, perfluoroheptanesulfonic acid, perfluorohexanesulfonic acid, perfluoropentanesulfonic acid, perfluorobutanesulfonic acid, perfluoropropanesulfonic acid, perfluorooctylphosphonic acid, perfluoroheptylphosphonic acid, perfluorohexylphosphonic acid, perfluoropentylphosphonic acid, perfluorobutylphosphonic acid, perfluoropropylphosphonicacid, (1H,1H,2H,2H-perfluorodecyl)phosphonic acid, (1H,1H,2H,2H-perfluorononyl)phosphonic acid, (1H,1H,2H,2H-perfluorooctyl)phosphonic acid, (1H,1H,2H,2H-perfluoroheptyl)phosphonic acid, (1H,1H,2H,2H-perfluorohexyl)phosphonic acid, (1H,1H,2H,2H-perfluoropentyl)phosphonic acid, compounds represented by Formulae (8)-(11):

(8)

wherein m is an integer of 2-7,

(9)

wherein k is an integer of 2-7,

(10)

wherein j is an integer of 2-7, and $$[CF_3(CF_2)_h CH(OH)CH_2O](O)P(OH)_2 \quad (11)$$

wherein h is an integer of from 2-7, a metal salt thereof and an ammonium salt thereof.

* * * * *